United States Patent
Wu

[19]

[11] Patent Number: 5,985,729
[45] Date of Patent: Nov. 16, 1999

[54] METHOD FOR MANUFACTURING A CAPACITOR OF A TRENCH DRAM CELL

[75] Inventor: Shye-Lin Wu, Hsinchu, Taiwan

[73] Assignee: Texas Instruments - Acer Incorporated, Hsinchu, Taiwan

[21] Appl. No.: 09/054,128

[22] Filed: Apr. 2, 1998

[30] Foreign Application Priority Data

Sep. 2, 1997 [TW] Taiwan ................................. 86112718

[51] Int. Cl.⁶ .............................................. H01L 21/8242
[52] U.S. Cl. ......................... 438/389; 438/386; 438/243; 438/246; 257/301
[58] Field of Search ..................... 438/386, 387, 438/388, 389, 700, 720, 243, 244, 245, 246, 247, 248, 249; 257/301, 310

[56] References Cited

U.S. PATENT DOCUMENTS 4,672,410  6/1987  Miura et al. ............................ 357/23.6
5,793,077  8/1998  Tseng ...................................... 257/301

OTHER PUBLICATIONS

B.W. Shen et al., Scalability of a Trench Capacitor Cell for 64Mbit DRAM, 1989 IEEE, pp. 27–30.
L. Nesbit et al., A 0.6μm² 256Mb Trench DRAM Cell with Self–Aligned Buried Strap (BEST), 1993 IEEE, pp. 627–630.
Tetsuya Homma et al., A Selective SiO₂ Film–Formation Technology Using Liquid–Phase Deposition for Fully Planarized Multilevel Interconnections, J. Electrochem. Soc., vol. 140, No. 8, Aug. 1993, pp. 2410–2414.
K.P. Muller et al., Trench Storage Node Technology for Gigabit DRAM Generations, 1996 IEEE, pp. 507–510.

*Primary Examiner*—Olik Chaudhuri
*Assistant Examiner*—Ginette Peralta
*Attorney, Agent, or Firm*—Harness, Dickey & Pierce, P.L.C.

[57] ABSTRACT

A silicon oxide layer is formed on the wafer to act as a pad layer. A silicon nitride layer is then formed on the silicon oxide layer to have a thickness approximate 1500–2000 angstroms. At least one trench is then created in the wafer. Then, an ion implantation process is performed with at least one titled angle to dope ions into the surface of the trenches. A LPD-oxide is selectively deposited in the trench. Then, a polysilicon layer is formed on the LPD-oxide and on the surface of the silicon nitride layer. Next, the polysilicon layer is etched to generate polysilicon side-wall spacers. The LPD-oxide is etched using the polysilicon side-wall spacers and the silicon nitride layer as an etching mask. The polysilicon side-wall spacers are then removed. A first conductive layer is formed on the silicon nitride layer, and refilled into the first trenches. The first conductive layer is then etched to at least to expose the LPD-oxide. The LPD-oxide is removed. A dielectric layer is then conformally deposited along the surface of the first storage nodes. A second conductive layer is deposited on the dielectric layer and refilled into the trench.

9 Claims, 4 Drawing Sheets

METHOD FOR MANUFACTURING A CAPACITOR OF A TRENCH DRAM CELL

FIELD OF THE INVENTION

The present invention relates to a method of fabricating a semiconductor device, and more specifically, to a method of forming a Dynamic Random Access Memory (DRAM) cell. Still more particularly, the present invention relates to a method of forming an improved DRAM cell capacitor in a trench.

BACKGROUND

In recent years. the development of semiconductor devices in which numerous elements are integrated on a chip. The development of a high density memory cell is being carried out. Particularly, a Dynamic Random Access Memories (DRAM) has been remarkably developed in terms of packing density. The DRAM is widely used in computer technology. Typically, the DRAM cells are applied to store data for a computer. These semiconductor memory devices have large capacitance for reading out and storing of information. Dynamic Random Access Memories are so named because their cells can retain information only temporarily, even with power continuously applied. The cells must therefore be read and refreshed at periodic intervals. An integrated circuit DRAM device typically has many memory cells. Indeed, a memory cell is provided for each bit stored by the DRAM device. Each memory cell typically consists of a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a DRAM memory cell includes the formation of a transistor, a capacitor and contacts to external circuits.

In order to achieve high density DRAM devices, the memory cells must be scaled down in size to the submicrometer range. This causes reduction in capacitor area, resulting in the reduction of cell capacitance. In this case, because the area of the charge storage capacitor is also decreased, the capacitance becomes relatively small. This decrease in storage capacitance leads to lower signal-to-noise ratios and increase errors due to alpha particle interference. Additionally, as the capacitance decreases, the charge held by storage capacitor must be refreshed often. A simple stacked planar capacitor generally cannot provide sufficient capacitance for good performance, even with high performance dielectric, such as $Ta_2O_5$.

Prior art approaches to overcome these problems have resulted in the development of the trench capacitor. The process that made the trench capacitor is anisotropic etching of a silicon substrate. In the conventional trench capacitor cell the plate electrode of the storage capacitor is inside the trench, and the storage electrode is in the substrate. A dielectric film is formed over the surface of the electrode. The upper electrode of the capacitor is a polysilicon layer extending into the trench. Thus, the capacitor for the memory cell is formed.

One of the prior arts related to the trench capacitor can be seen in U.S. Pat. No. 5,374,580. Further, other approach can also be seen, for example "Trench Storage Node Technology for Gigabit DRAM Generations, K. P. Muller at el, 1996 IEEE, IEDM 96–507". Please see "A 0.6 $\mu m^2$ 256 Mb Trench DRAM Cell With Self-Aligned BuriEd STrap (BEST), L. Nesbit et al, 1993 IEEE, IEDM 93–627" and "SCALABILITY OF A TRENCH CAPACITOR CELL FOR 64 MBIT DRAM, B. W. Shen et al, 1989 IEEE, IEDM 89–27".

In addition, the silicon dioxide that is formed by using liquid phase deposition (LPD-oxide) exhibits good selective deposition and good flow characteristic. Thus, the LPD-oxide is an excellent trench-filling material. The basic reaction associated with the deposition of the LPD-oxide involves the action of the Si—OH. The dehydration reaction between the siloxane oligomers and Si—OH can be referenced to "A Selective SiO2 Film-Formation Technology Using Liquid-Phase Deposition for Fully Planarized Multi-level Interconnections, Tetsuya, Homma et al, J. Electrochem Soc., Vol. 140 No. 8, August 1993, The Electrochemical Society, Inc.". The chemical reactions for the LPD-oxide have been proposed by Nagayma as the following formulas:

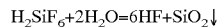
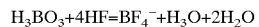

SUMMARY

In accordance with the present invention, a method of manufacturing a capacitor is provided. In one embodiment adapted for use in a DRAM cell will be described as follow.

A silicon oxide layer is formed on the wafer to act as a pad layer. A silicon nitride layer is then formed on the silicon oxide layer to have a thickness approximate 1500–2000 angstroms. Then, the silicon oxide, the silicon nitride layer are patterned by well known photolithography. At least one trench is then created in the wafer by using the photoresist as an etching mask. Then, an ion implantation process is performed with at least one titled angle to dope ions into the surface of the trenches. A LPD-oxide is selectively deposited in the trench. Then, a polysilicon layer is formed on the LPD-oxide and on the surface of the silicon nitride layer. Next, the polysilicon layer is etched by using anisotropical etch to generate polysilicon side-wall spacers on the side walls of the silicon nitride layer and the silicon oxide layer.

The LPD-oxide is etched using the polysilicon side-wall spacers and the silicon nitride layer as an etching mask. The polysilicon side-wall spacers are then removed by dry etching to expose the LPD-oxide. The wafer exposed by the LPD-oxide is also etched, simultaneously. A first conductive layer is formed on the silicon nitride layer, and refilled into the first trenches The first conductive layer is then etched to at least to expose the LPD-oxide. The LPD-oxide is removed by using HF solution, HF vapor or the BOE (buffer oxide etching) solution. After the LPD-oxide is removed, pillars formed of first conductive layer are formed in the trench. A dielectric layer is then conformally deposited along the surface of the first storage nodes. A second conductive layer is deposited on the dielectric layer and refilled into the trench.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate a DRAM cell capacitor by using a LPD-oxide technology. The formation of the trench DRAM cell includes many process steps that are well known in the art. For example, the processes of lithography masking and etching are used extensively in an embodiments of the present invention.

Figure 1:
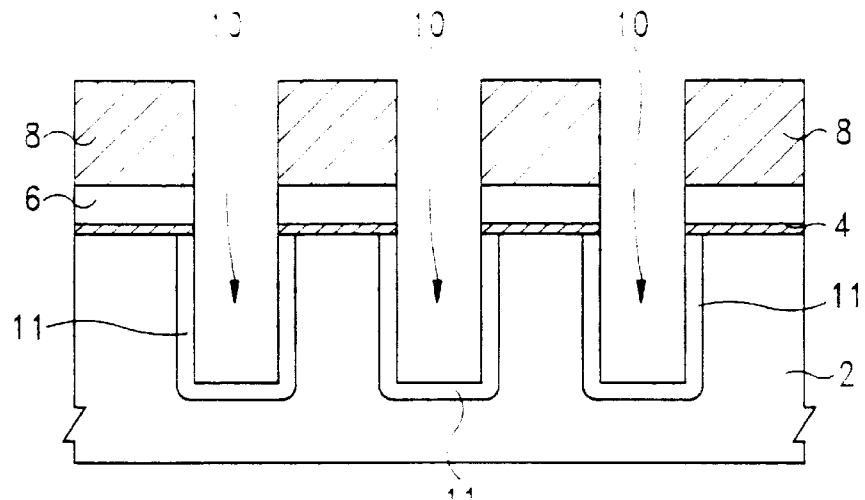
FIG. 1 is a cross-sectional view of a semiconductor wafer illustrating the steps of forming trenches in a wafer, according to one embodiment of the present invention.

Referring to FIG. 1, a single crystal silicon wafer 2 with a <100>crystallographic orientation is provided. A thermal silicon oxide layer 4 of 30 to hundreds angstroms is formed on the wafer 2 to act as a pad layer. The pad oxide is formed to reduce the stress between the wafer 2 and a subsequent silicon nitride layer. The pad oxide layer can also be formed by any suitable chemical vapor deposition. A silicon nitride layer 6 is then formed on the silicon oxide layer 4 to have a thickness approximate 1500–2000 angstroms. Then, the silicon oxide 4, the silicon nitride layer 6 are patterned by well known photolithography, leaving an exposed area where the capacitor will be formed in subsequent processes. Thus, a photoresist 8 is patterned on the silicon nitride layer 6 to define at least one trench region. One or more first trenches 10 are then created in the wafer 2 by using the photoresist 8 as an etching mask to etch the silicon oxide layer 4, the silicon nitride layer 6 and the wafer 2. The first trenches 10 are formed by using anisotropic etching, such as RIE (reactive ion etch). Then, an ion implantation process is performed with at least one titled angle to dope ions into the surface of the trenches. Therefore, the first storage nodes 11 for capacitors are formed.

Figure 2:
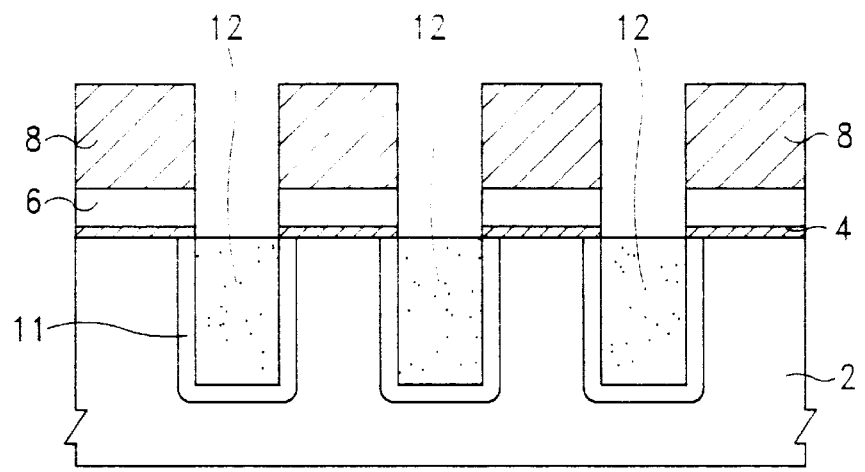
FIG. 2 is a cross-sectional view of a semiconductor wafer illustrating the steps of forming a LPD-oxide in the trenches, according to one embodiment of the present invention.

Turning to FIG. 2, a IPD-oxide 12 is selectively deposited in the first trenches 10. The LPD-oxide 12 exhibits good selective deposition characteristic, therefore, it can be easy to control the LPD-oxide 12 be formed in the first trenches 10 only.

Figure 3:
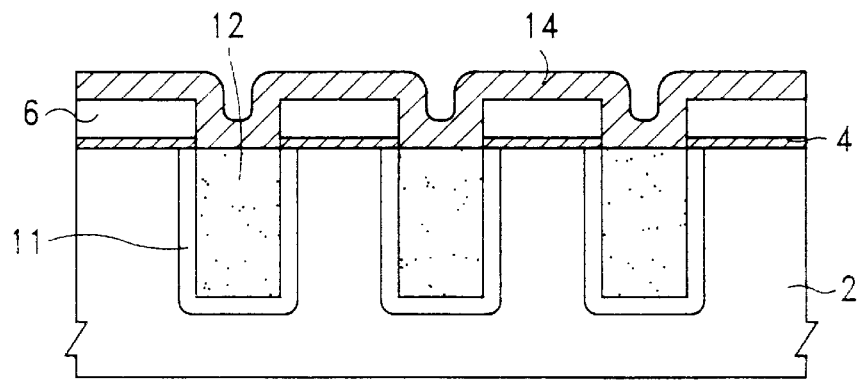
FIG. 3 is a cross-sectional view of a semiconductor wafer illustrating the steps of forming a polysilicon layer on the LPD-oxide layer and a silicon nitride layer, according to one embodiment of the present invention.
Figure 4:
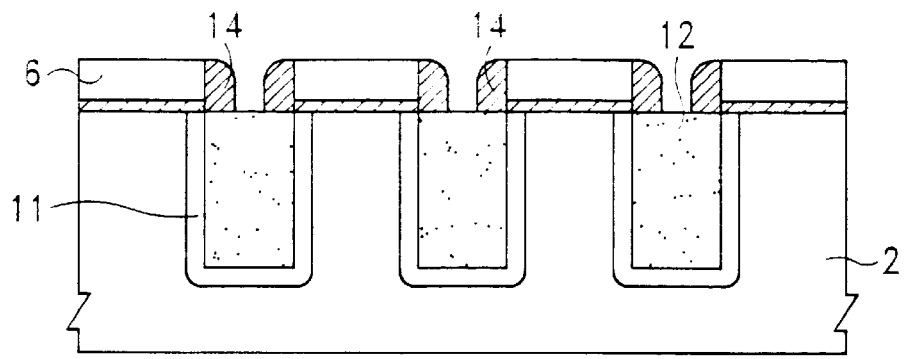
FIG. 4 is a cross-sectional view of a semiconductor wafer illustrating the step of forming polysilicon side-wall spacers on the side walls of the silicon nitride layer, according to one embodiment of the present invention.

Referring to FIG. 3, after the LPD-oxide 12 is formed, the photoresist 8 is removed and the silicon nitride layer 6 is exposed. Then, a polysilicon layer 14 is formed on the LPD-oxide 12 and on the surface of the silicon nitride layer 6. Next, as shown in FIG. 4, the polysilicon layer 14 is etched by using anisotropical etch to generate polysilicon side-wall spacers on the side walls of the silicon nitride layer 6 and the silicon oxide layer 4. Further, a portion of the LPD-oxide layer 12 is not covered by the polysilicon side-wall spacers 14.

Figure 5:
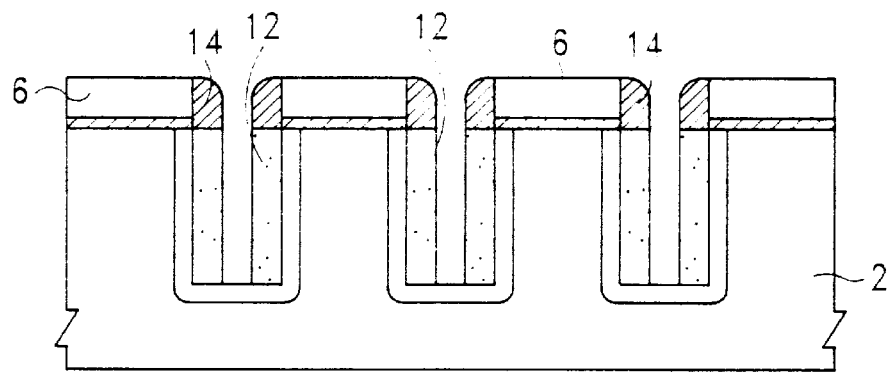
FIG. 5 is a cross-sectional view of a semiconductor wafer illustrating the steps of etching the LPD-oxide layer using the polysilicon side-wall spacers as an etching mask, according to one embodiment of the present invention.

Turning to FIG. 5, the LPD-oxide 12 is etched using the polysilicon side-wall spacers 14 and the silicon nitride layer 6 as an etching mask. In the step, the etchant is preferably have a high etching selectivity between the oxide and polysilicon. Namely, the etching rate of the oxide is faster than the one of the polysilicon. The etchant is selected from the group of $CCl_2F_2$, $CHF_3/CF_4$, $CHF_3/O_2$, $CH_3CHF_2$, $CF_4/O_2$, $C_2F_6$ or $C_3F_8$. In the preferred embodiment, the LPD-oxide 12 is etched to expose a portion of the wafer 2.

Figure 6:
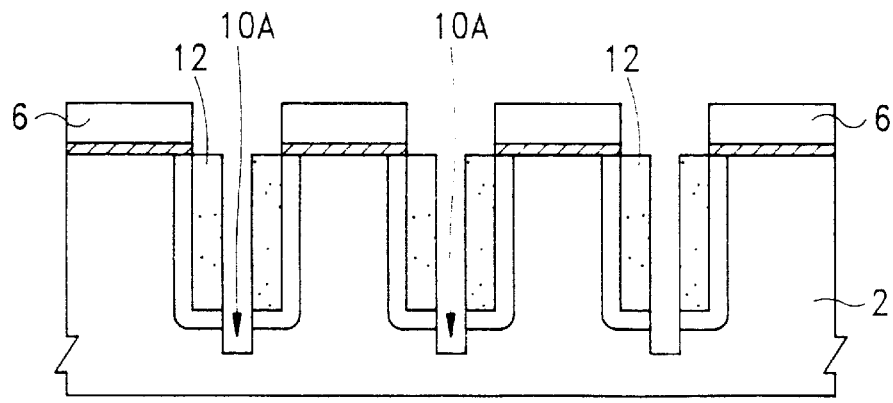
FIG. 6 is a cross-sectional view of a semiconductor wafer illustrating the step of removing the polysilicon side-wall spacers, according to one embodiment of the present invention.

Turning to FIG. 6, the polysilicon side-wall spacers 14 are then removed by dry etching to expose the LPD-oxide 12. The wafer 2 exposed by the LPD-oxide 12 is also etched, simultaneously. Second trenches IOA that are relatively deep to the first trenches 10 from the surface of the LPD-oxide 12 are formed in the wafer 2. Preferably, the etchant of the step is chosen from $SiCl_4/Cl_2$, $BCl_3/Cl_2$, $HBr/Cl_2/O_2$, $HBr/O_2$, $Br_2/SF_6$ or $SF_6$.

Figure 7:
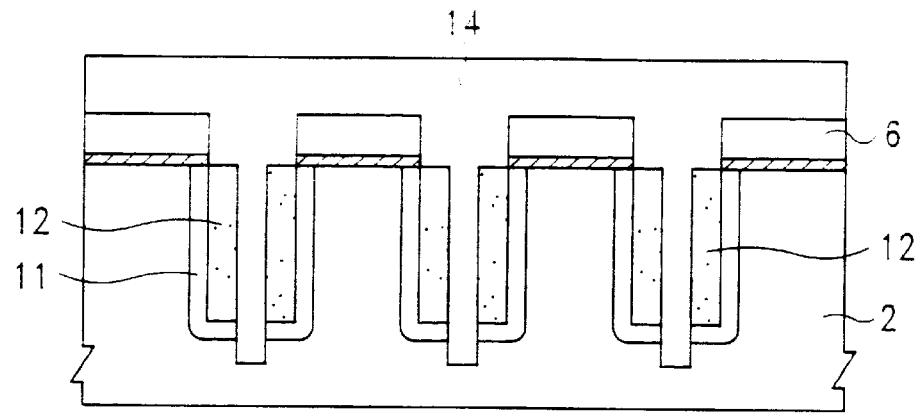
FIG. 7 is a cross-sectional view of a semiconductor wafer illustrating the step of forming a first conductive layer, according to one embodiment of the present invention.
Figure 8:
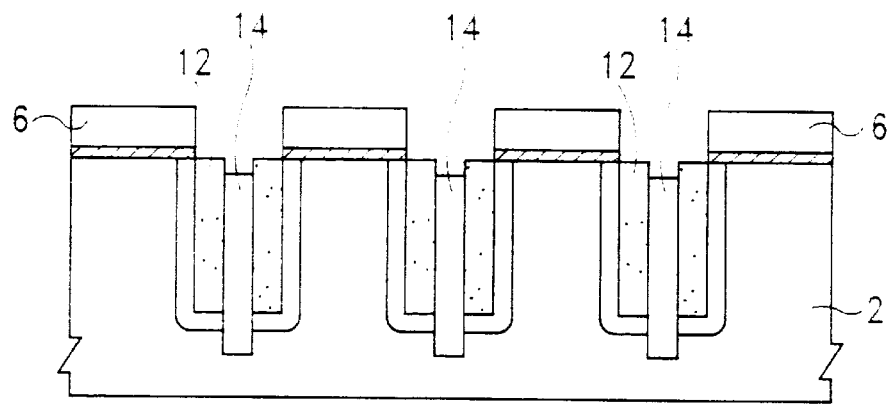
FIG. 8 is a cross-sectional view of a semiconductor wafer illustrating the step of etching the first conductive layer, according to one embodiment of the present invention.

As shown in FIG. 7a first conductive layer 14 is formed on the silicon nitride layer 6, and refilled into the first trenches 10 and the second trenches 10A. The first conductive layer 14 is preferably either doped polysilicon or in-situ doped polysilicon. The first conductive layer is then etched to the surface of the LPD-oxide 12, as shown in FIG. 8. The first conductive layer 14 is formed in the trenches 10, 10A. Preferably, the surface of the first conductive layer 14 is lower than the surface of the LPD-oxide 12. the etchant for the etching step is chosen from $SiCl_4/Cl_2$, $BCl_3/Cl_2$, $HBr/Cl_2/O_2$, $HBr/O_2$, $Br_2/SF_6$ or $SF_6$.

Figure 9:
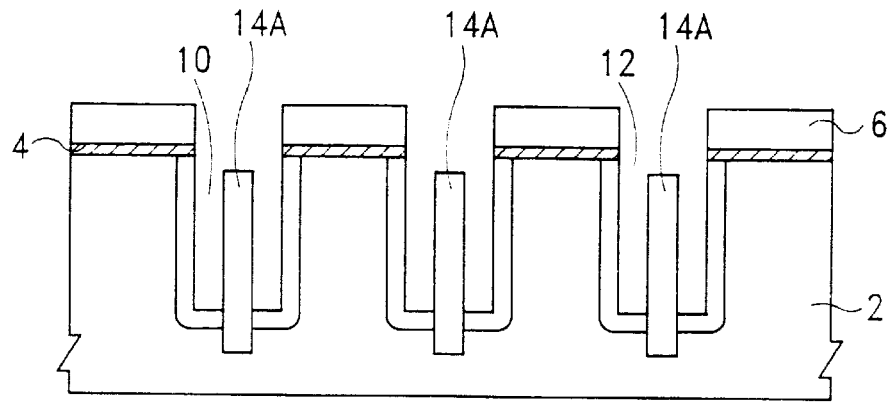
FIG. 9 is a cross-sectional view of a semiconductor wafer illustrating the step of removing the LPD-oxide layer, according to one embodiment of the present invention.

Turning to FIG. 9, the LPD-oxide 12 is removed by using HF solution, HF vapor or the BOE (buffer oxide etching) solution as an etchant. After the LPD-oxide 12 is removed, pillars 14A formed of first conductive layer 14 are formed in the first trenches 10, and the bottom portion of the conductive pillars 14A extend into the wafer 2. The conductive pillars 14A serve as the first storage nodes for the capacitors. Thus, the first storage node includes the conductive pillars 14A and the doped ions regions 11.

Figure 10:
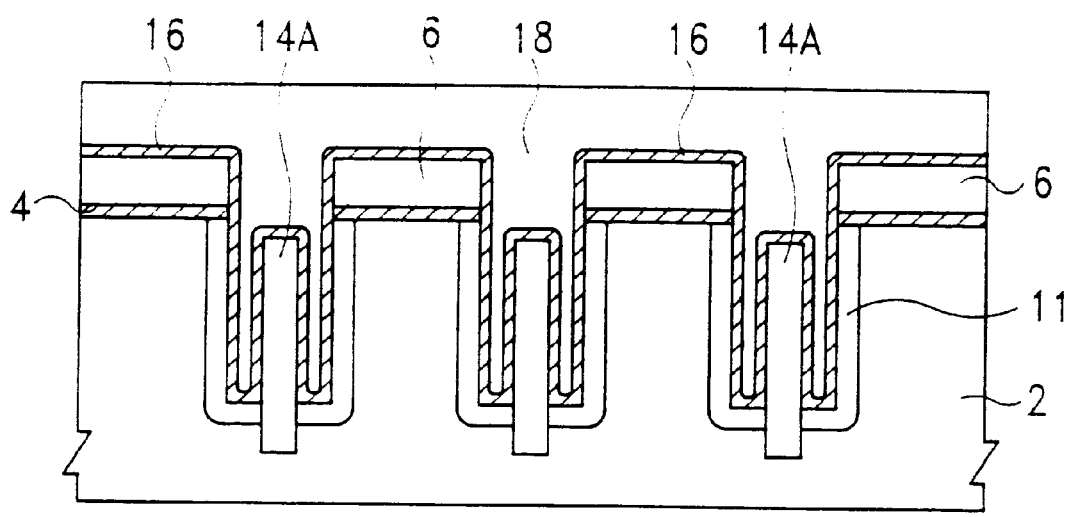
FIG. 10 is a cross-sectional view of a semiconductor wafer illustrating the steps of forming a dielectric film and a second conductive layer, according to one embodiment of the present invention.

Turning to FIG. 10, a dielectric layer 16 is then conformally deposited along the surface of the first storage nodes and on the surface of the silicon oxide layer 4, silicon nitride layer 6. The dielectric layer 16 can be formed of a silicon nitride/silicon oxide double-film, a silicon oxide/silicon nitride/silicon oxide triple-film, or any other high dielectric film such as tantalum oxide ($Ta_2O_5$), BST, PZT. Afterwards, a second conductive layer 18 is deposited on the dielectric layer 16 and refilled into the trenches 10 using a conventional LPCVD process. Similarly, The second conductive layer 18 is preferably either doped polysilicon or in-situ doped polysilicon. Metal or metal alloy may serve as the second conductive layer 18.

FIG. 10 is the final structure of the present invention. The trench capacitor includes a trench that is formed in the semiconductor wafer 2. A first storage node includes a doped ion region 11 and an conductive pillar 14A. The doped region is formed in a surface of the trench. The conductive pillar 14A is formed in the trench, and a bottom portion of the conductive pillar extends into the wafer. An isolation structure 4, 6 is formed on the wafer and adjacent to the trench. A dielectric layer 16 substantially conformally covers the first storage node and a second storage node 18 is formed over the isolation structure 4, 6 and on the dielectric layer 16.

Accordingly, the semiconductor capacitors are formed which has relatively large electrode surface area while occupying a relatively small area of the substrate. Therefore, the capacitors according to the present invention has a relatively large capacitance, thereby supporting good performance and high density.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method of forming a capacitor in a semiconductor wafer, said method comprising:

patterning a mask layer on said semiconductor wafer by a photoresist to define a first trench region;

etching said wafer using said photoresist as an etching mask to form a first trench in said wafer;

forming a doped ion region into a surface of said first trench;

selectively forming a liquid phase deposition oxide (LPD-oxide) in said first trench;

removing said photoresist;

forming a polysilicon layer on said mask layer and on said LPD-oxide;

anisotropically etching said polysilicon to form side-wall spacers on side walls of said mask layer, a portion of said LPD-oxide being exposed by said side-wall spacers;

etching said LPD-oxide to expose a portion of said first trench using said mask layer, said side-wall spacers as an etching mask;

etching said side-wall spacers, and etching said exposed first trench to form a second trench into said semiconductor wafer;

forming a first conductive layer on said mask layer and into said first, second trenches;

etching said first conductive layer to expose a surface of said LPD-oxide;

removing said LPD-oxide, thereby forming a conductive pillar formed by said first conductive layer in said first trench, a bottom portion of said conductive pillar being in said second trench, wherein said doped ion region and said conductive pillar serves as a first storage node of said capacitor;

forming a dielectric layer on a surface of said mask layer, on a surface of said first trench and on a surface of said conductive pillar; and forming a second conductive layer on said dielectric layer, wherein said second conductive layer serves as a second storage node of said capacitor.

2. The method of claim 1, wherein said mask layer comprising:

a pad oxide formed on said wafer; and a silicon nitride layer formed on said pad oxide.

3. The method of claim 1, wherein an etchant to etch said LPD-oxide is selected from the group consisting of $CCl_2F_2$, $CHF_3/CF_4$, $CHF_3/O_2$, $CH_3CHF_2$, $CF_4/O_2$, $C_2F_6$ and $C_3F_8$.

4. The method of claim 1, wherein an etchant to remove said side-wall spacers is selected from the group consisting of $SiCl_4/Cl_2$, $BCl_3/Cl_2$, $HBr/Cl_2/O_2$, $Br/O_2$, $Br_2/SF_6$ and $SF_6$.

5. The method of claim 1, wherein said LPD-oxide is removed by using an etchant that is selected from the group consisting of HF solution, HF vapor and BOE (buffer oxide etching) solution.

6. The method of claim 1, wherein said first conductive layer is selected from the group consisting of doped polysilicon and in-situ doped polysilicon.

7. The method of claim 6, wherein an etchant to etch said first conductive layer is selected from the group consisting of $SiCl_4/Cl_2$, $BCl_3/Cl_2$, $HBr/Cl_2/O_2$, $HBr/O_2$, $Br_2/SF_6$ and $SF_6$.

8. The method of claim 1, wherein said dielectric layer is selected from the group consisting of tantalum oxide ($Ta_2O_5$), BST, PZT, a triple film of silicon oxide/silicon nitride/silicon oxide and a double film of silicon nitride/silicon oxide film.

9. The method of claim 1, wherein said second conductive layer is selected from the group of doped polysilicon, in-situ doped polysilicon, metal and metal alloy.

* * * * *